United States Patent
Tohyama et al.

(10) Patent No.: US 6,433,367 B1
(45) Date of Patent: Aug. 13, 2002

(54) SEMICONDUCTOR DEVICE WITH SLOPING SIDES, AND ELECTRONIC APPARATUS INCLUDING SEMICONDUCTOR DEVICES WITH SLOPING SIDES, MODIFIED FOR CRACK-FREE WIRE BONDING

(75) Inventors: Hiroshi Tohyama; Susumu Ozawa; Satoru Yamada, all of Hachioji (JP)

(73) Assignee: Oki Data Corporation, Tokyo (JP)

( * ) Notice: Subject to any disclaimer, the term of this patent is extended or adjusted under 35 U.S.C. 154(b) by 8 days.

(21) Appl. No.: 09/599,106

(22) Filed: Jun. 22, 2000

(30) Foreign Application Priority Data

Jul. 9, 1999 (JP) .......................... 11-195313

(51) Int. Cl.$^7$ .............................. H01L 33/00
(52) U.S. Cl. .................... 257/88; 257/92; 257/443; 257/79; 257/81; 257/82; 257/723
(58) Field of Search ................. 257/684, 685, 257/723, 784, 787, 79, 81, 82, 88

(56) References Cited

U.S. PATENT DOCUMENTS 5,037,780 A * 8/1991 Fujimoto et al. .......... 437/212
5,872,700 A * 2/1999 Collander .................. 361/760
5,886,404 A * 3/1999 You ........................... 257/692
5,999,413 A * 12/1999 Ohuchi et al. .............. 361/722

OTHER PUBLICATIONS

Kayama et al.(ed.), "VLSI Packaging for Logic Devices," vol. 2, Nikkei BP, 1993, pp. 17–30.

* cited by examiner

Primary Examiner—David L. Talbott
Assistant Examiner—Luan Thai
(74) Attorney, Agent, or Firm—Akin, Gump, Strauss, Hauer & Feld, L.L.P.

(57) ABSTRACT

A semiconductor device has a first surface with at least one wire bonding pad, a second surface located opposite to the first surface, and at least one side sloping inward from the first surface to the second surface. According to a first aspect of the invention, all wire bonding pads formed on the first surface are formed in the part opposite the second surface, so that mechanical loads applied during wire bonding are transmitted to the second surface and do not cause cracks in the sloping side. According to a second aspect of the invention, when an array of such semiconductor devices is mounted on a substrate, resin mounds supporting the sloping sides are formed between the semiconductor devices, so that mechanical loads transmitted to the sloping sides during wire bonding are then transmitted through the resin mounds to the substrate.

11 Claims, 9 Drawing Sheets

SEMICONDUCTOR DEVICE WITH SLOPING SIDES, AND ELECTRONIC APPARATUS INCLUDING SEMICONDUCTOR DEVICES WITH SLOPING SIDES, MODIFIED FOR CRACK-FREE WIRE BONDING

BACKGROUND OF THE INVENTION

The present invention relates to the general field of semiconductor technology, and in particular to wire bonding.

Wire bonding is a well-known technique for electrically connecting a semiconductor device to another device, or to the board, card, or other substrate on which the semiconductor device is mounted. Wire-bonding methods can be classified into nail-bonding methods and wedge-bonding methods. In both methods, a fine wire is connected at one end to a bonding pad formed on the semiconductor device, and at the other end to a bonding pad formed on the other device, or a wiring pattern formed on the substrate. The wire is attached to the bonding pad on the semiconductor device by a solid-phase diffusion bond. The solid-phase diffusion bond is created by placing the end of the fine wire in contact with the bonding pad, applying heat and/or ultrasonic waves, and placing a load (of, for example, 50–150 grams) on the fine wire and bonding pad with a tool referred to as a capillary or wedge. Wire bonding is a high-speed process, and is widely used in volume production.

Wire bonding must sometimes be performed on semiconductor devices with sloping sides or sloping ends. For example, the present inventors have found that it is advantageous for light-emitting diode (LED) array chips to have ends that slope inward from the upper surface, on which the LEDs and bonding pads are located, to the lower surface. The advantage is that when two such LED array chips are placed end-to-end, the chance of unwanted contact between their ends is reduced.

A problem is that when a bonding wire is attached to a bonding pad disposed above a sloping end of an LED array chip, the load applied during the wire-bonding process stresses the sloping surface, and may produce a harmful crack. Further explanation of this problem will be given in the detailed description of the invention.

It is anticipated that similar problems may occur in semiconductor laser array chips.

SUMMARY OF THE INVENTION

An object of the present invention is to enable wire bonding to be performed on semiconductor devices having sloping sides, without the formation of cracks.

According to a first aspect of the invention, a semiconductor device has two opposing surfaces, referred to below as a first surface and a second surface, and at least one sloping side that slopes inward from the first surface to the second surface. Because of the sloping side, only part of the first surface directly faces the second surface. The semiconductor device also has least one bonding pad formed on the first surface. Every bonding pad on the first surface is disposed within the part of the first surface that directly faces the second surface. Mechanical loads applied during wire bonding are therefore transmitted to the second surface and dissipated in the supporting substrate, whereby stress and cracks are prevented.

According to a second aspect of the invention, an electronic apparatus includes a plurality of semiconductor devices, each having a first surface, a second surface opposing the first surface, and a pair of sloping ends that slope inward from the first surface to the second surface. Wire bonding pads are formed on the first surfaces of the semiconductor devices. The second surfaces of the semiconductor devices are attached by resin to a supporting substrate, the semiconductor devices being placed end-to-end on the substrate. The resin also forms mounds in the spaces between adjacent semiconductor devices, these mounds supporting the sloping ends of the semiconductor devices. During wire bonding, applied mechanical loads which are transmitted to the sloping ends are then transmitted through the resin mounds to the supporting substrate, whereby stress and cracks are prevented.

DETAILED DESCRIPTION OF THE INVENTION

Embodiments of the invention will be described with reference to the attached drawings, following a more detailed description of an example of a conventional semiconductor device with sloping sides and ends. The terms 'side'0 and 'end' are used below for convenience, but no particular distinction is drawn between them. An end may be regarded as a type of side, or a side as a type of end.

Figure 1:
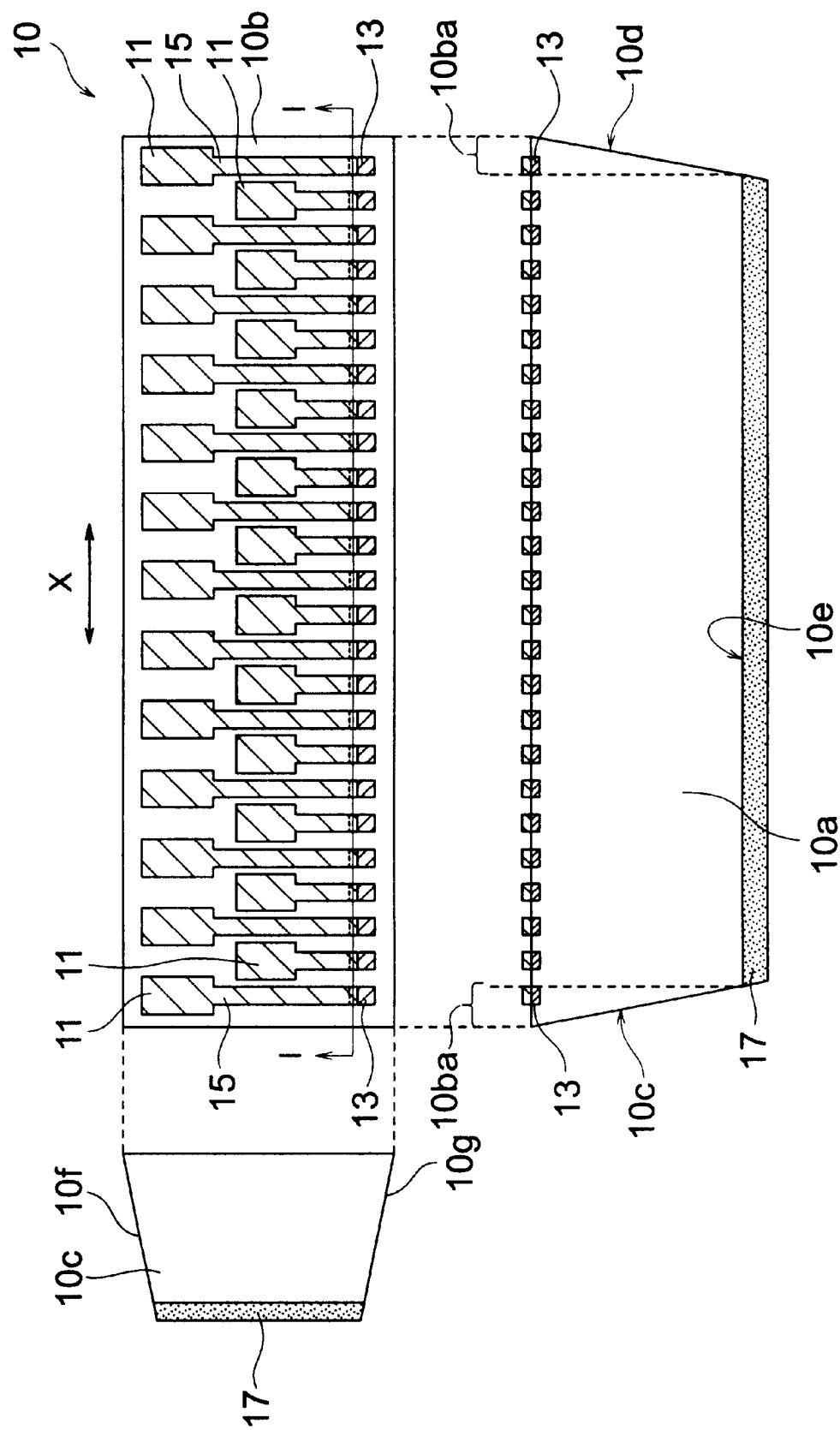
FIG. 1 is a first angle projection of a conventional LED array chip with sloping ends and sides.

Referring to FIG. 1, the conventional semiconductor device is an LED array chip 10 of the type used in an LED print head in a printer. The LED array chip 10 comprises a compound semiconductor substrate 10*a* with a rectangular first surface 10*b*, a pair of sloping ends 10*c*, 10*d* meeting the first surface 10*b*, a second surface 10*e* disposed opposite to the first surface 10b, also met by the sloping ends 10c, 10d, and a pair of sides 10f, 10g meeting the two surfaces 10b, 10e. The ends 10c, 10d slope inward from the first surface 10b to the second surface 10e, so that the first surface 10b opposes both the second surface 10e and the sloping ends 10c, 10d. Portions 10ba of the semiconductor substrate 10a accordingly project beyond the second surface 10e. The sides 10f, 10g may also slope inward from the first surface 10b to the second surface 10e, as shown, but this is not necessary; the sides 10f, 10g may be perpendicular to the surfaces 10b, 10e if so desired.

A double row of bonding pads 11 and a single row of LEDs 13 are formed on the first surface 10b of the LED array chip 10. The bonding pads 11 are electrically coupled to the LEDs 13 by individual electrodes 15. The LEDs 13 form an array extending in the X direction, parallel to the long axis of the first surface 10b. Each LED 13 forms a pn junction with the compound semiconductor substrate 10a. A common electrode 17 is formed on the second surface 10e.

The side view shown at the bottom of FIG. 1 is a sectional view through the line marked I—I in the plan view shown at top right in FIG. 1.

The LED array chip 10 in FIG. 1 is fabricated from a semiconductor wafer with a diameter smaller than the width of the paper normally used in printers (smaller than the width of letter-size paper, for example). Moreover, the wafer is diced into a large number of LED array chips, making the length of each LED array chip 10 in the X direction equal to only a small fraction of the width of a printed page. In an LED print head, accordingly, it is necessary to place a number of these LED array chips 10 end-to-end to form a single linear light-emitting array with sufficient length to print on paper of normal width.

Figure 2:
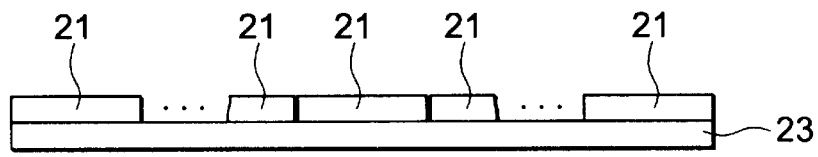
FIG. 2 is a sectional view of an electronic apparatus including an array of LED array chips with vertical ends.
Figure 3:
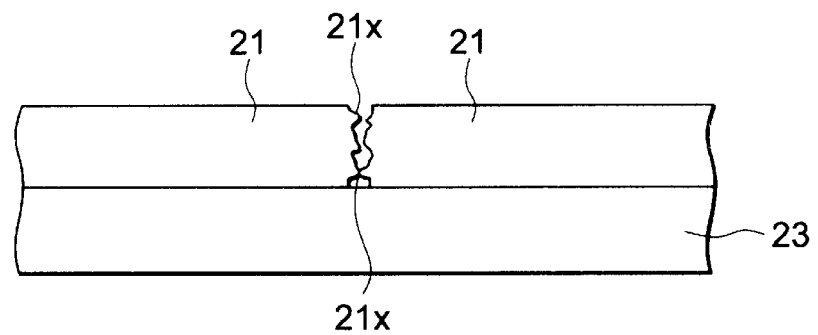
FIG. 3 is an enlarged sectional view showing adjacent ends of two of the LED array chips in FIG. 2.

FIG. 2 shows how a plurality of LED array chips 21 can be mounted end-to-end on a supporting substrate 23 to form a single long array. The LED array chips 21 in FIG. 2, however, have vertical ends. Moreover, as shown in the enlarged view in FIG. 3, the ends of the LED array chips 21 are not smooth, but have irregular projections 21x left by mechanical cutting with a dicing saw during the fabrication process. When two LED array chips 21 are mounted on the substrate 23, if projections 21x on their rough ends make contact, as shown, the LED array chips 21 may be damaged.

Figure 4:
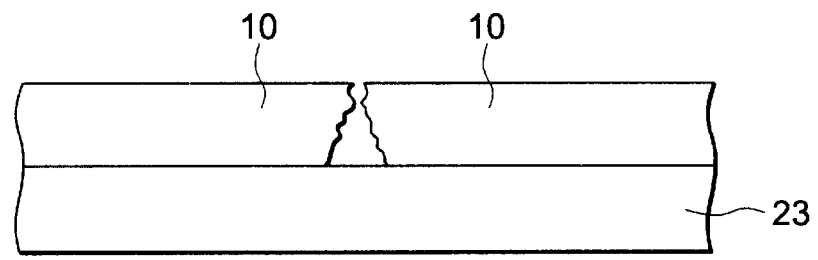
FIG. 4 is an enlarged sectional view showing two LED array chips with sloping ends mounted in mutually adjacent positions in an array.

FIG. 4 shows part of a similar array comprising LED array chips 10 with sloping ends. Although the ends are still rough, the probability of contact between the two facing ends is greatly reduced, because the two ends slope away from each other. This is the advantage of sloping ends.

Figure 5:
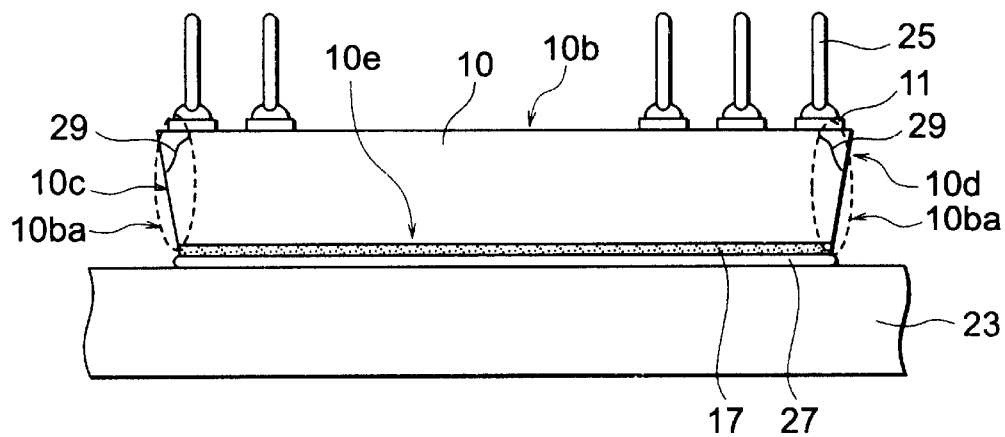
FIG. 5 is a sectional view showing a conventional LED array chip with sloping ends, with bonding wires attached.

Referring to FIG. 5, each LED array chip 10 is attached to the supporting substrate 23 by means of an adhesive substance such as die-bonding resin 27. During wire bonding, mechanical loads applied to most of the bonding pads 11 are transmitted from the first surface 10b to the second surface 10e, then through the die-bonding resin 27 to the substrate 23. These loads are absorbed in the substrate 23 and do not strain the LED array chip 10.

Two of the bonding pads 11, however, are located partly on the projecting parts 10ba of the LED array chip 10, facing the sloping ends 10c, 10d. When bonding wires 25 are attached to these two bonding pads, part of the applied mechanical load is transmitted only as far as the sloping ends 10c, 10d. The load therefore produces stress and strain within the projecting parts 10ba of the LED array chip 10, and the stress and strain may in turn produce cracks 29 in the projecting parts 10ba. These cracks 29 can damage the bonding pads 11 and cause electrical faults, leading to irregular optical output and printing defects. This is the problem posed by sloping ends.

Figure 6:
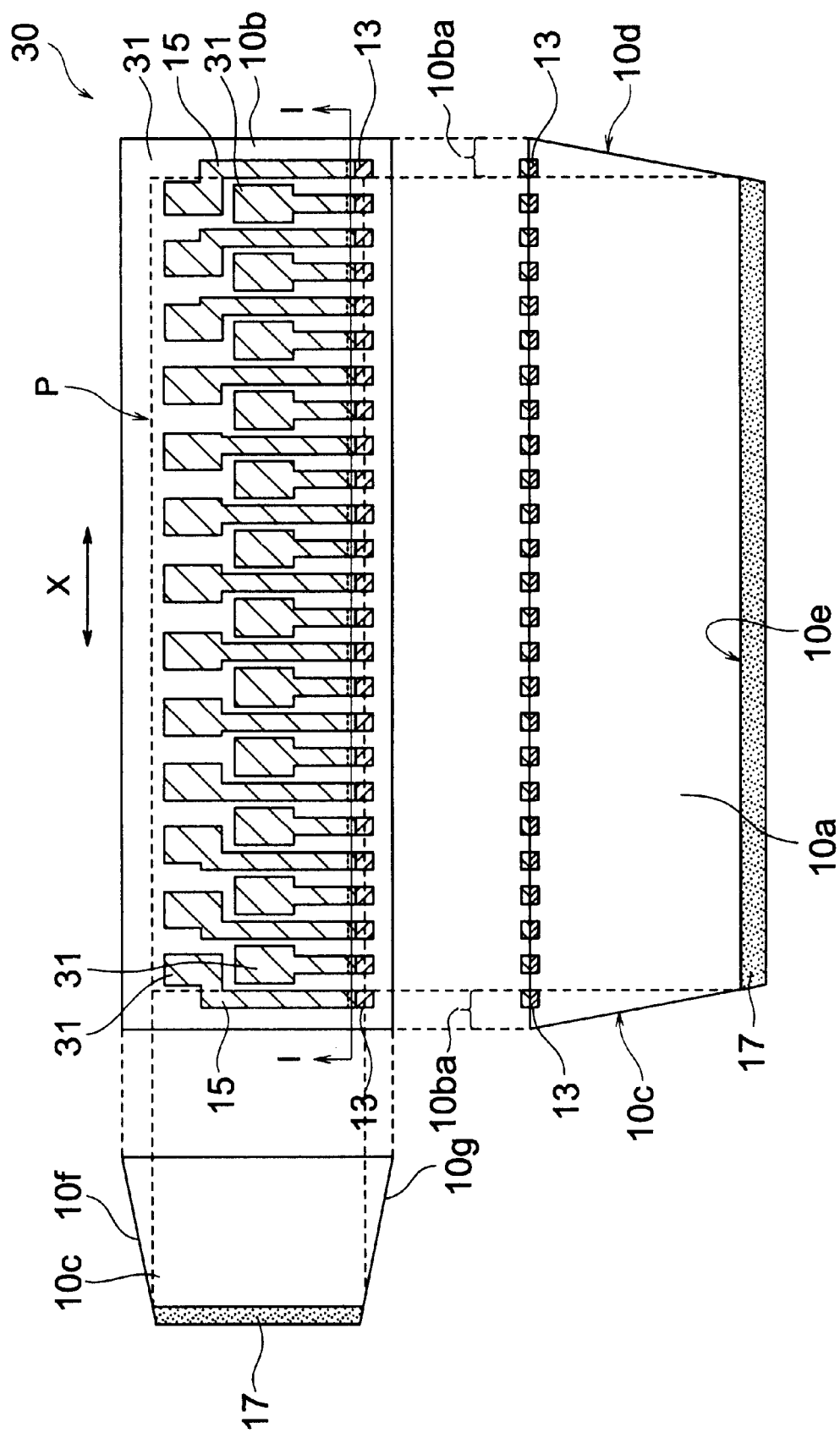
FIG. 6 is a first angle projection of an LED array chip embodying the first aspect of the present invention.

Referring now to FIG. 6, an example of a semiconductor device embodying the first aspect of the present invention is an LED array chip 30 comprising a compound semiconductor substrate 10a with a rectangular first surface 10b, a pair of sloping ends 10c, 10d meeting the first surface 10b, a second surface 10e disposed opposite to the first surface 10b, meeting the sloping ends 10c, 10d, and a pair of sides 10f, 10g meeting the two surfaces 10b, 10e. The compound semiconductor substrate 10a comprises, for example, gallium arsenide (GaAs) or gallium arsenide phosphide (GaAsP). The first surface 10b has a long axis and a short axis. The sloping ends 10c, 10d are disposed at extremities of the long axis, and extend parallel to the short axis. The ends 10c, 10d slope inward from the first surface 10b to the second surface 10e, as in the conventional device shown in FIG. 1. The sides 10f, 10g may also slope inward from the first surface 10b to the second surface 10e, as shown, in which case the first surface 10b opposes the second surface 10e, both sloping ends 10c, 10d and both sloping sides 10f, 10g. Alternatively, the sides 10f, 10g may be perpendicular to the surfaces 10b, 10e, in which case the first surface 10b opposes the second surface 10e and the sloping ends 10c, 10d.

A double row of bonding pads 31 and a single row of LEDs 13 are formed on the first surface 10b of the LED array chip 10. The bonding pads 31 are electrically coupled to the LEDs 13 one-to-one, by individual electrodes 15. The LEDs 13 form an array extending in the X direction, parallel to the long axis of the first surface 10b. Each LED 13 includes a diffusion region (not visible) forming a pn junction with the compound semiconductor substrate 10a. A common electrode 17 is formed on the second surface 10e.

The difference between the LED array chip 30 in FIG. 6 and the conventional LED array chip 10 in FIG. 1 is that all of the bonding pads 31 in FIG. 6 are formed within the part P of the first surface 10b that directly opposes the second surface 10e. This part P is indicated by hatching in FIG. 7, in which the bonding pads, LEDs, and electrodes are omitted for clarity. As can be seen by a comparison of FIG. 6 with FIG. 1, the bonding pads 31 in FIG. 6 are brought within part P of the first surface 10b by a modification of the positional relationships between the bonding pads and individual electrodes 15.

Figure 7:
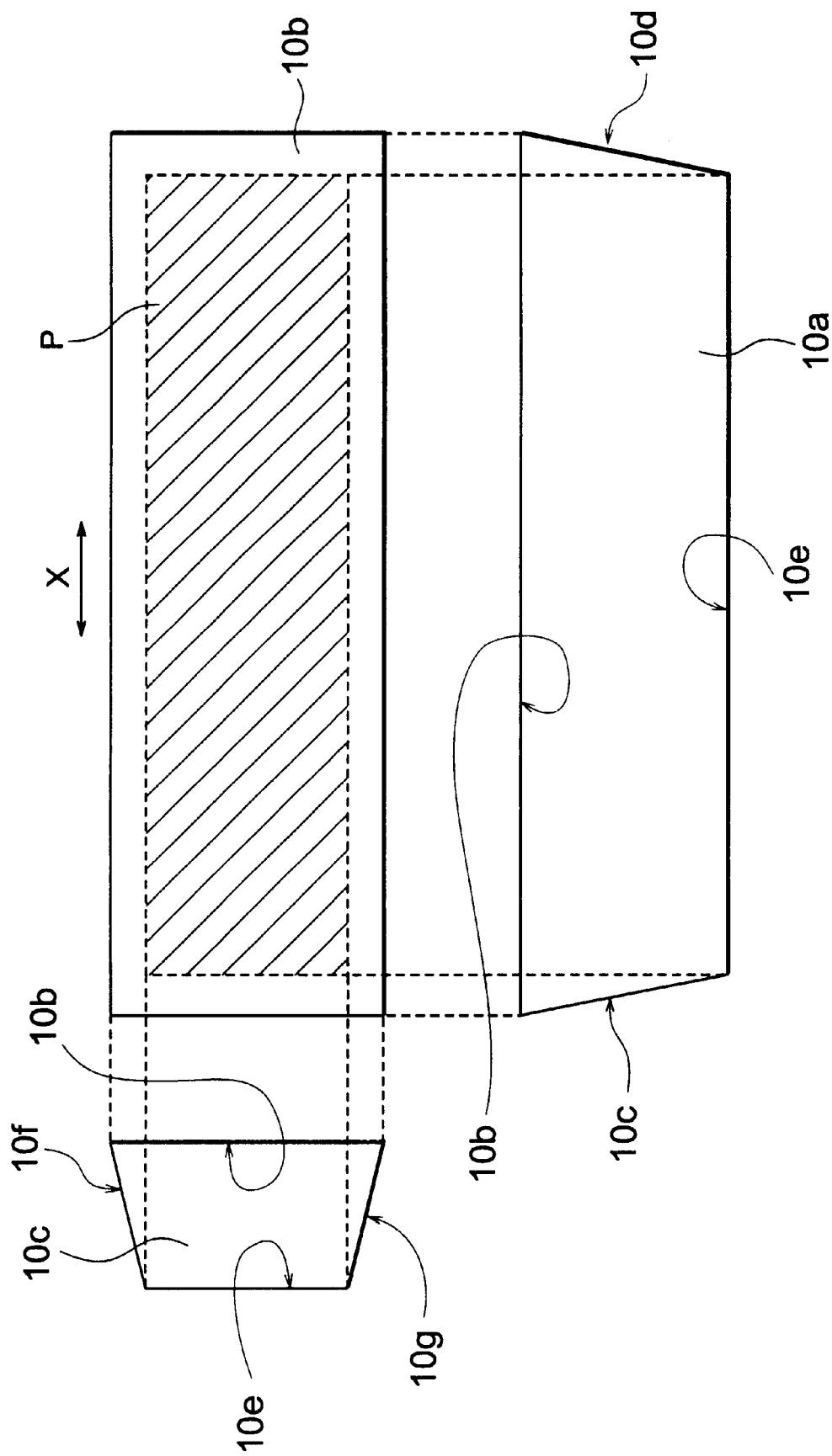
FIG. 7 is a simplified first angle projection of the LED array in FIG. 6.
Figure 8:
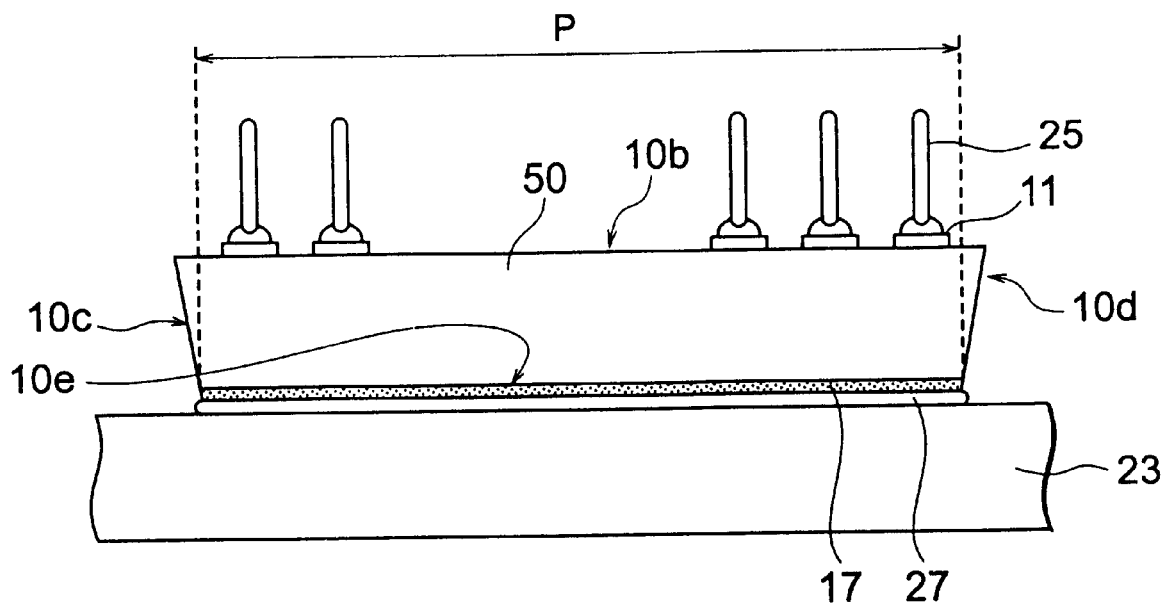
FIG. 8 is a side view of the LED array chip in FIG. 6 mounted on a substrate.

As can be seen in FIG. 7, any mechanical load placed on part P of the first surface 10b is transmitted to the second surface 10e, and is not transmitted to the sloping ends 10c, 10d or sloping sides 10f, 10g. Referring to FIG. 8, after the LED array chip 30 has been attached to a supporting substrate 23 by die-bonding resin 27, when bonding wires 25 are attached to the bonding pads 31, the loads placed on the bonding pads 31 are transmitted to the second surface 10e, then through the common electrode 17 and die-bonding resin 27 into the supporting substrate 23. Consequently, the sloping ends 10c, 10d are not stressed, and cracks do not form in the projecting parts of the compound semiconductor substrate 10a.

By preventing the formation of cracks, the first aspect of the invention improves manufacturing yields of semiconductor devices having sloping ends or sloping sides, and improves the reliability of electronic apparatus in which the semiconductor devices are used as components.

Examples of electronic apparatus embodying the first and second aspects of the invention will be described next.

Figure 9:
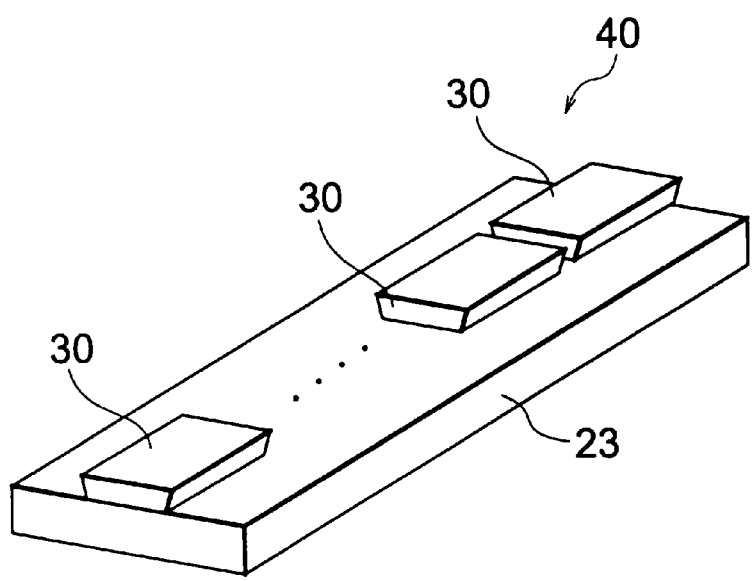
FIG. 9 is a perspective view of an electronic apparatus embodying the first aspect of the invention.

FIG. 9 shows an example of an electronic apparatus embodying the first aspect of the invention. The apparatus is an LED print head 40 comprising a row of at least two LED array chips 30 of the invented type, mounted end-to-end on a supporting substrate 23 to form a single linear array of light-emitting elements. As described above, the sloping ends of the LED array chips 30 prevent unwanted contact between adjacent devices, and the location of the bonding pads (not visible) prevents stress from causing cracks during the wire-bonding process. These features enhance the reliability of the LED print head 40.

Figure 10:
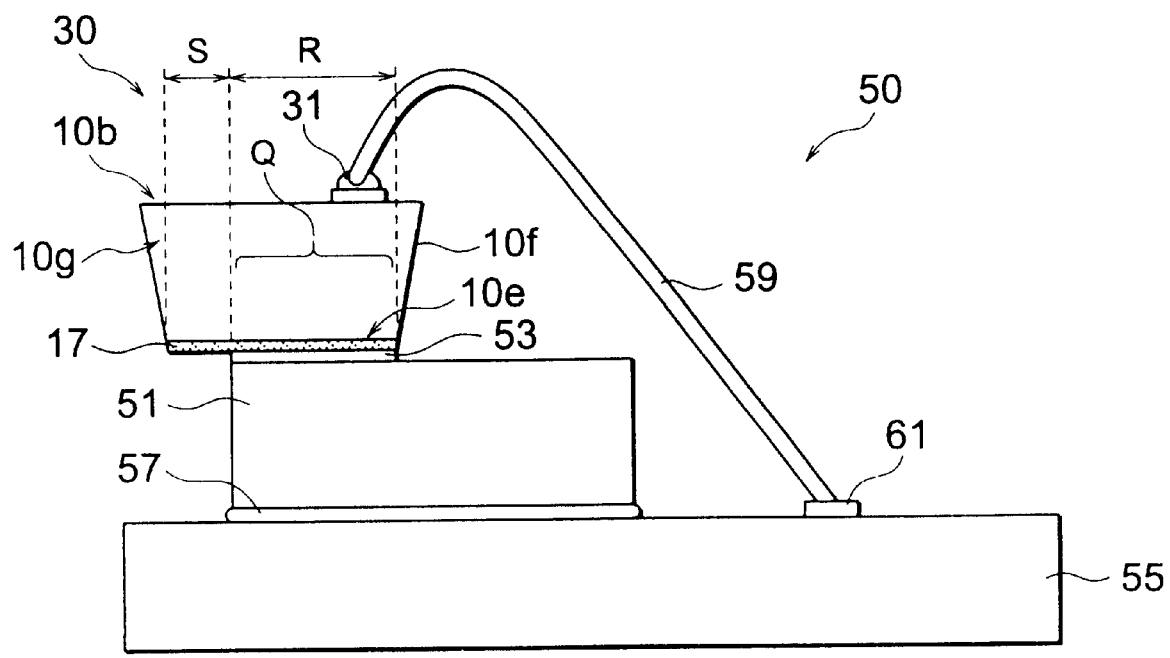
FIG. 10 is a side view of another electronic apparatus embodying the first aspect of the invention.

FIG. 10 shows another example of an electronic apparatus embodying the first aspect of the invention. The apparatus is an LED print head 50 seen end-on, looking in the direction parallel to the array axis. The LED print head 50 comprises at least two LED array chips 30 of the invented type, each mounted on a driver device 51. The driver device 51 is also a semiconductor device, being, for example, an integrated circuit formed in a silicon chip. In this mounting scheme, one part Q of the second surface 10e of each LED array chip 30 (more precisely, one part Q of the common electrode 17) is attached to the upper surface of the driver device 51 by die-bonding resin 53. The bonding pads 31 are disposed in the facing part R of the first surface 10b of the LED array chip 30. No bonding pads are disposed in the part S that is not directly supported by the driver device 51. Besides avoiding the area S, the bonding pads 31 also avoid areas disposed over sloping ends or sloping sides (e.g., sloping side 10f) of the LED array chips 30.

The lower surface of each driver device 51 is attached to a supporting substrate 55 by die-bonding resin 57. The bonding pads 31 on the first surfaces 10b of the LED array chips 30 are connected by wires 59 to bonding pads 61 on the surface of the supporting substrate 55.

This mounting scheme reduces the overall size of the LED print head 50. The reason why the LED array chips 30 are only partially supported on the driver devices 51 is that it is also desirable, for economic reasons, to minimize the size of the driver devices 51, and it is necessary to leave a certain part of the upper surface of each driver device 51 uncovered by the LED array chips 30, this being a part in which circuit elements of the driver device 51 are formed.

In the wire-bonding process, the loads applied to the bonding pads 31 are transmitted through the LED array chips 30 to their second surfaces 10e, through the die-bonding resin 53 to the driver devices 51, then through the driver devices 51 and die-bonding resin 57 to the supporting substrate 55. Accordingly, the loads do not cause cracks in either the LED array chips 30 or the driver devices 51, and high manufacturing yields and high reliability are again achieved.

Figure 11:
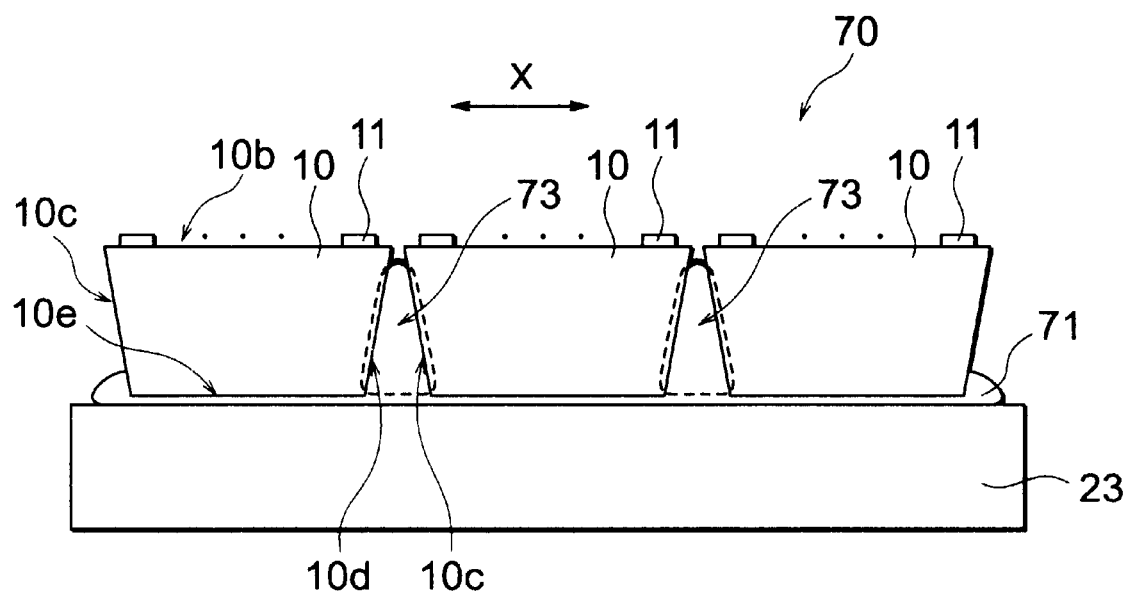
FIG. 11 is a side view of an electronic apparatus embodying the second aspect of the invention.

As an example of an electronic apparatus embodying the second aspect of the invention, FIG. 11 shows an LED print head 70 comprising a row of at least two conventional LED array chips 10 attached by die-bonding resin 71 to a supporting substrate 23. Each LED array chip 10 has a first surface 10b with bonding pads 11, a second surface 10e, and ends 10c, 10d sloping inward from the first surface 10b to the second surface 10e, as described earlier. The outermost bonding pads 11 on each LED array chip 10 are partly disposed above the sloping ends 10c, 10d.

A feature of this electronic apparatus is that the die-bonding resin 71 rises to form resin mounds 73 that at least partly fill in the spaces between adjacent LED array chips 10, thereby supporting the sloping ends 10c, 10d. The height of these resin mounds 73 should be at least half the height of the LED array chips 10, and preferably exceeds two-thirds of the height of the LED array chips 10. Ideally, the resin mounds 73 fill in substantially all the space between each adjacent pair of LED array chips 10, as shown.

During the wire-bonding process, mechanical loads applied to bonding pads 11 disposed above the sloping ends 10c, 10d of the LED array chips 10 are transmitted to these sloping ends, but are then transmitted through the resin mounds 73 to the substrate 23. These loads, accordingly, do not stress the sloping ends 10c, 10d of the LED array chips 10, and do not cause cracks. High manufacturing yields and high reliability are again achieved, and the bonding pads 11 can be placed closer to the edges of the LED array chips 10 than in the embodiments of the invention described above. Accordingly, more space is available for forming the bonding pads 11 in FIG. 11 than in FIG. 6, so the bonding pads 11 can be made larger and more space can be left between adjacent bonding wires. These features enhance the reliability and yield of the wire-bonding process.

Figure 12:
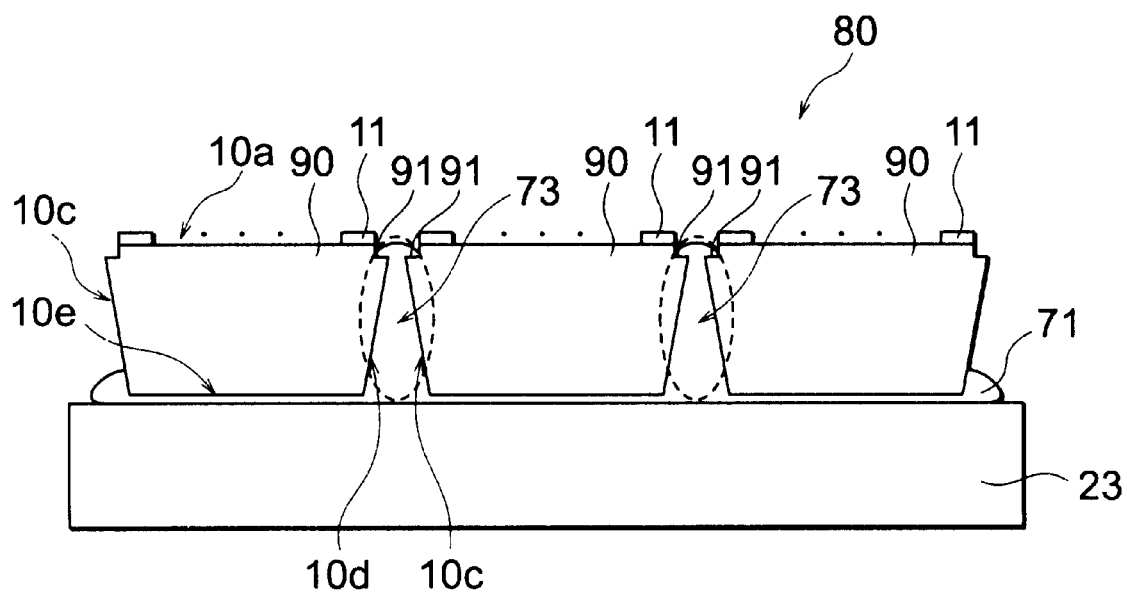
FIG. 12 is a side view of another electronic apparatus embodying the second aspect of the invention.

As another example of an electronic apparatus embodying the second aspect of the invention, FIG. 12 shows an LED print head 80 comprising a row of at least two LED array chips 90. These LED array chips 90 differ from the conventional LED array chips 10 in having reduced-height portions 91 disposed where the sloping ends 10c, 10d of the chip meet the first surface 10b. In other respects, the LED array chips 90 in FIG. 12 are similar to the conventional LED array chips 10 shown in FIG. 1, and they are mounted on a substrate 23 by a die-bonding resin 71 as explained in FIG. 11, the die-bonding resin 71 rising to form resin mounds 73 filling the spaces between adjacent LED array chips 90.

The purpose of the reduced-height portions 91 is to hold die-bonding resin that is drawn by capillary action up to the tops of the LED array chips 90, so that the resin does not overflow onto the first surfaces 10b of the LED array chips 90 and reach the LEDs (not visible) disposed thereon. If resin were to reach the LEDs, the resulting blockage of emitted light might impair the optical characteristics of the array, leading to printing defects.

The reduced-height portions 91 may have any convenient shape, width, and depth, provided they are not so large as to interfere with the operation of the LED array chips 90. For example, the reduced-height portions 91 should not encroach on the light-emitting areas of the LEDs. The reduced-height portions 91 preferably extend the full width of the LED array chips 90, in the direction parallel to the short axis of the first surface 10b, perpendicular to the array axis, so as to prevent overflow of resin onto any part of the first surfaces 10b of the LED array chips 90.

The resin mounds 73 serve the same purpose in FIG. 12 as in FIG. 11, transmitting mechanical loads from the sloping ends 10c, 10d of the LED array chips 90 to the substrate 23, thereby avoiding stress and cracks. However, whereas in FIG. 11 careful attention must be paid to the spacing of the LED array chips 10 and the amount of die-bonding resin 71 applied, in order to prevent overflow of resin onto the surfaces of the LED array chips 10, the requirements in FIG. 12 are less exacting, because the reduced-height portions 91 can hold a certain amount of resin overflow. The LED print head 80 in FIG. 12 is accordingly easier to manufacture than the LED print head 70 in FIG. 11.

Next, a simple and accurate method of fabricating LED array chips 90 with sloping ends and reduced-height portions 91 will be described.

Figure 13A:
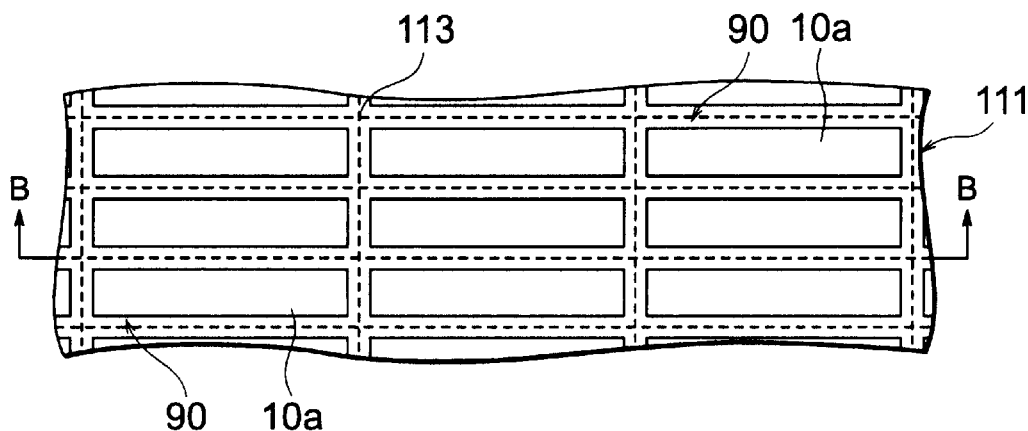
FIGS. 13A, 13B, and 13C illustrate steps in the fabrication of semiconductor devices of the type shown in FIG. 12.

Referring to FIG. 13A, a large number of LED array chips 90 are fabricated simultaneously from a single wafer 111 of a semiconductor material. FIG. 13A shows only part of the wafer 111. Well-known processes such as film deposition, photolithography, patterning, and diffusion of impurities are carried out to form the LEDs, bonding pads, and electrodes (not visible) on the first surface 10a of each LED array chip 90. After these steps are completed, the wafer 111 will be diced into individual chips 90 along dicing lines indicated by dotted lines 113 in FIG. 13A.

Figure 13B:
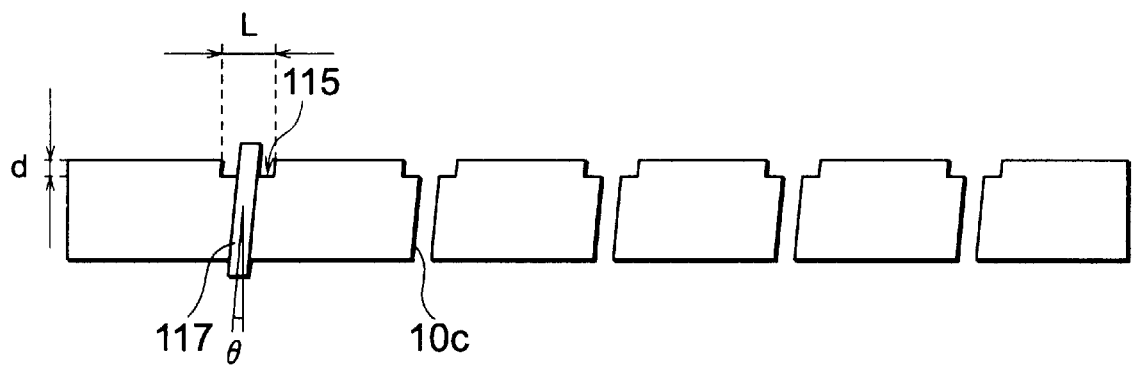

Referring to FIG. 13B, which shows a sectional view through line B—B in FIG. 13A, before the dicing is carried out, grooves 115 are formed, centered on the dicing lines that extend parallel to the ends of the LED array chips 90; that is, parallel to the short axis and perpendicular to the array axis of each LED array chip 90. The grooves 115 are formed by well-known photolithography and etching techniques. That is, photolithography is used to form an etching mask, and the parts of the wafer 111 not covered by the etching mask are etched by a suitable dry etching or wet etching process. The etching mask can be at least partly formed during the formation of other elements in the LED array chips 90, to assure correct alignment.

The width (L) of the grooves 115 must exceed the width of the dicing saw 117 that will be used to cut the wafer 111 into chips, but the grooves must not be so wide as to encroach on the light-emitting areas of the LEDs. Since etching proceeds both vertically and laterally, this restriction on the width (L) of the grooves 115 also restricts their depth (d) to some extent. No grooves need be formed on the dicing lines extending parallel to the array axes of the LED array chips 90.

Figure 13C:
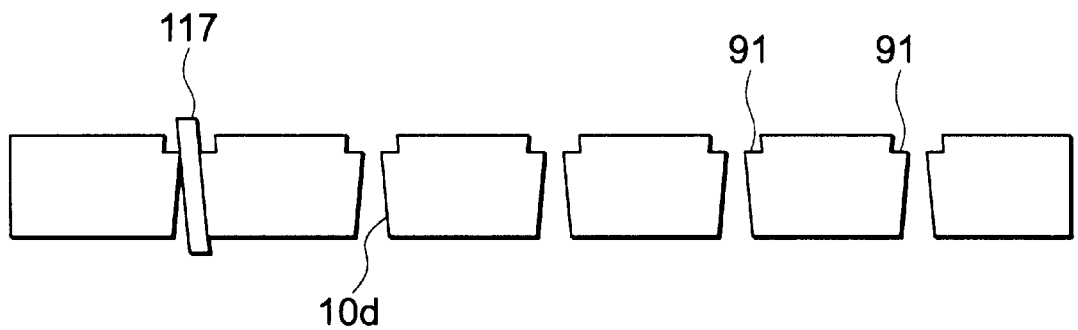

After the grooves 115 have been formed, the dicing saw 117 is tilted at a certain angle θ with respect to the wafer 111 (alternatively, the wafer 111 is tilted with respect to the dicing saw 117), and dicing cuts are made through the center lines of the grooves 115. These cuts form the sloping ends 10c of the LED array chips 90. Referring to FIG. 13C, the dicing saw 117 (or wafer 111) is then tilted at the same angle θ in the opposite direction, and the dicing cuts are repeated, forming the sloping ends 10d. The parts of the grooves 115 that are left by these dicing cuts become the reduced-height portions 91 of the LED array chips 90.

Following these dicing cuts, dicing cuts are made in the perpendicular direction, that is, the direction parallel to the array axes of the LED array chips 90, thereby separating the LED array chips 90 from one another.

Finally, a simple method of forming the resin mounds 73 shown in FIGS. 11 and 12 when the LED array chips are mounted on the substrate 23 will be described.

Figure 14A:
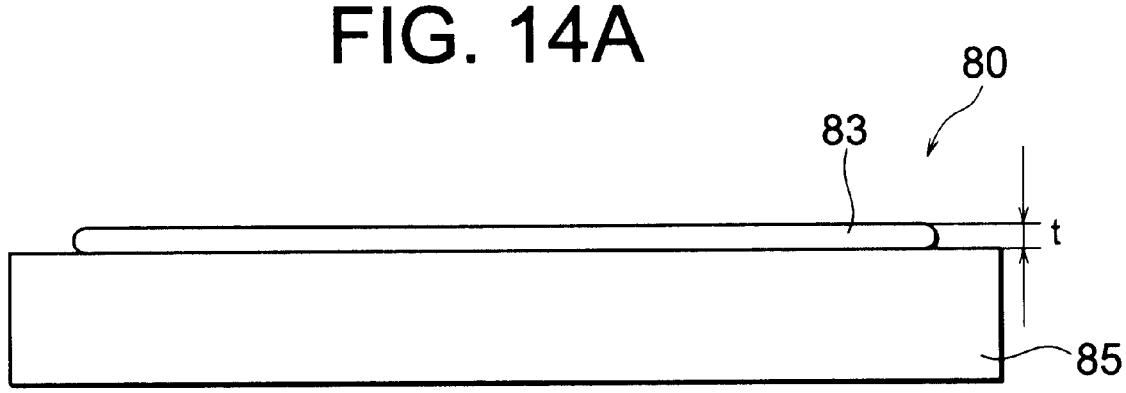
FIGS. 14A and 14B illustrates steps in the fabrication of an electronic apparatus of the type shown in FIG. 11 or FIG. 12.

Referring to FIG. 14A, a layer of die-bonding resin 71 with a suitable thickness (t) is applied to the area on the surface of the substrate 23 on which the LED array chips will be mounted. The thickness t determines the height of the resin mounds that will be formed. The desired value of t varies depending on factors such as the viscosity of the resin and the volume of space that will be left between adjacent LED array chips when they are mounted.

Figure 14B:
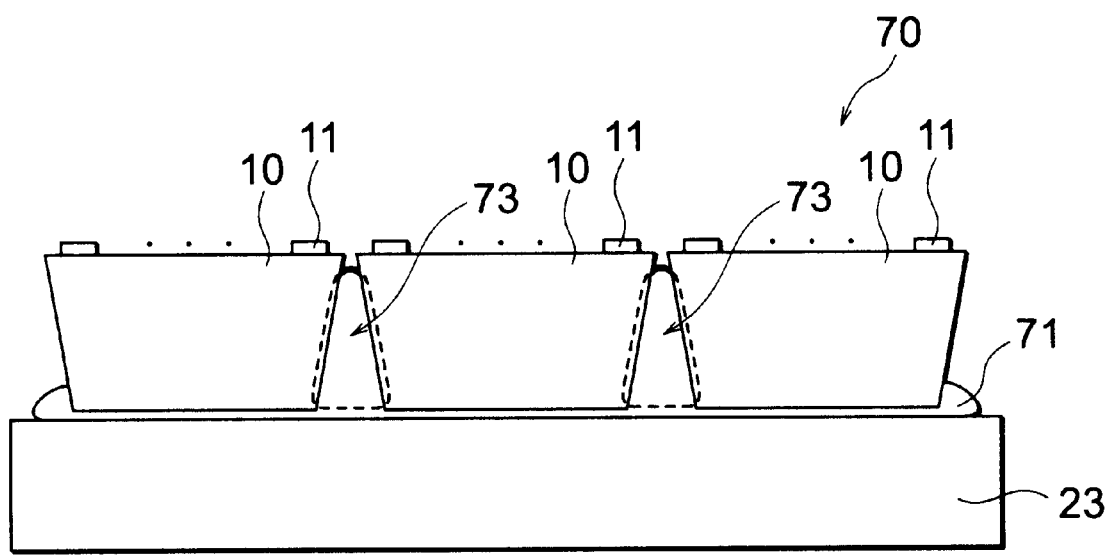

Referring to FIG. 14B, the LED array chips 10 are positioned accurately in a row on the substrate 23, using well-known positioning techniques, and are then pressed down into the die-bonding resin 71. The die-bonding resin 71 is thereby forced to rise in the spaces between adjacent LED array chips 10, forming the resin mounds 73. The die-bonding resin 71 is then cured to complete the mounting process.

Although conventional LED array chips 10 were shown in FIG. 14B, the same method can of course be employed with LED array chips 90 having reduced-height portions 91 as shown in FIG. 12.

The manufacturing processes described above enable the invention to be practiced without significantly increased manufacturing costs.

The invention has been described in relation to LED array chips and an LED print head, but is not restricted to these particular semiconductor devices and apparatus. The invention can also be practiced with semiconductor laser array chips, for example, or any other type of semiconductor light-emitting array devices. More generally, the invention is applicable to any semiconductor device having at least one sloping side or end, and at least one bonding pad disposed near the sloping side or end.

In the second aspect of the invention, the resin mounds may have any height that provides adequate support for the sloping ends of the semiconductor devices. If adequate support is provided by a height less than half the height of the semiconductor devices, the resin mounds may be less than half as high as the semiconductor devices.

The two aspects of the invention may be combined.

Those skilled in the art will recognize that further variations are possible within the scope claimed below.

What is claimed is:

1. A semiconductor device having a first surface, a second surface parallel to and opposing the first surface, and at least one sloping side sloping inward from the first surface to the second surface, the first surface thus opposing both the second surface and the sloping side, comprising:

a light-emitting element formed on a part of the first surface opposing the sloping side; and a bonding pad, electrically coupled to the light-emitting element, formed on a part of the first surface opposing the second surface.

2. The semiconductor device of claim 1, wherein:

the first surface is rectangular, having a long axis and a short axis; and the semiconductor device has two sloping sides, disposed at opposite extremities of the long axis, both of these two sloping sides sloping inward from the first surface to the second surface, said at least one sloping side being one of these two sloping sides.

3. An electronic apparatus comprising:

a substrate; and at least two semiconductor devices as described in claim 2, attached by their second surfaces to the substrate, the long axes of their first surfaces being mutually aligned, the semiconductor devices thus forming a linear array.

4. The semiconductor device of claim 2, wherein said first surface has portions with reduced height, said two sloping sides meeting the first surface in said portions with reduced height.

5. The semiconductor device of claim 2, having an array of light-emitting elements disposed on the first surface, parallel to the long axis thereof, the light-emitting element formed on the part of the first surface opposing the sloping side being one of said light-emitting elements.

6. The semiconductor device of claim 2, having an array of light-emitting diodes disposed on the first surface, parallel to the long axis thereof, the light-emitting element formed on the part of the first surface opposing the sloping side being one of said light-emitting diodes.

7. An LED print head, comprising:

a substrate; and at least two semiconductor devices as described in claim 6, attached by their second surfaces to the substrate, the long axes of their first surfaces being mutually aligned, the light-emitting diodes of all of the semiconductor devices thus forming a single linear array of light-emitting diodes.

8. An electronic apparatus having a substrate, at least two semiconductor devices disposed in a linear array on the substrate, and a coating of resin attaching the semiconductor devices to the substrate, the linear array having an array axis passing through all of the semiconductor devices, each semiconductor device among the semiconductor devices having a first surface, a second surface parallel to and opposing the first surface, two sloping sides sloping inward from the first surface to the second surface, the first surface thus opposing both the second surface and the sloping sides, and at least one bonding pad disposed on a part of the first surface opposing one of the sloping sides, comprising:

for each mutually adjacent pair of said semiconductor devices, a resin mound formed from said resin, disposed between said mutually adjacent pair of said semiconductor devices, supporting one of the two sloping sides of each semiconductor device in said mutually adjacent pair of said semiconductor devices, thereby supporting said bonding pad so that a bonding process can be performed to attach a wire to the bonding pad without damage to the semiconductor device.

9. The electronic apparatus of claim 8, wherein each said resin mound fills substantially all space between said mutually adjacent pair of semiconductor devices.

10. The electronic apparatus of claim 8, wherein the first surface of each said semiconductor device has portions with reduced height, said two sloping sides meeting the first surface in said portions with reduced height.

11. The electronic apparatus of claim 8, wherein said semiconductor devices are LED array chips, each having an array of light-emitting diodes disposed parallel to the array axis, the electronic apparatus constituting an LED print head.

\* \* \* \* \*